United States Patent
Mori

(10) Patent No.: US 7,714,613 B2
(45) Date of Patent: May 11, 2010

(54) LEVEL CONVERTER

(75) Inventor: Toshihiko Mori, Kawasaki (JP)

(73) Assignee: Fujitsu Microelectronics Limited, Yokohama (JP)

( * ) Notice: Subject to any disclaimer, the term of this patent is extended or adjusted under 35 U.S.C. 154(b) by 0 days.

(21) Appl. No.: 12/413,746

(22) Filed: Mar. 30, 2009

(65) Prior Publication Data

US 2009/0243654 A1 Oct. 1, 2009

(30) Foreign Application Priority Data

Mar. 31, 2008 (JP) ............................. 2008-093419

(51) Int. Cl.
*H03K 19/094* (2006.01)
*H03L 5/00* (2006.01)

(52) U.S. Cl. ......................................... 326/63; 327/333

(58) Field of Classification Search ............. 326/62–64, 326/68; 327/333
See application file for complete search history.

(56) References Cited

U.S. PATENT DOCUMENTS 5,764,097 A 6/1998 Whitfield 6,873,186 B2 3/2005 Gion
2008/0136489 A1* 6/2008 Nojiri ......................... 327/333
2008/0265970 A1* 10/2008 Vlasenko .................... 327/333
2009/0174433 A1* 7/2009 Pasqualini ................... 326/73

FOREIGN PATENT DOCUMENTS

| JP | 5-343980 A | 12/1993 |
| JP | 2816124 B | 10/1998 |
| JP | 2005-33718 A | 2/2005 |

* cited by examiner

*Primary Examiner*—Rexford N Barnie
*Assistant Examiner*—Thienvu V Tran
(74) *Attorney, Agent, or Firm*—Fujitsu Patent Center

(57) ABSTRACT

A level converter includes a cross-coupled section for holding data and a first switching section connected in series with the cross-coupled section and supplied with a differential input signal. The level converter has a second switching section, a current mirror connection section, a third switching section, and an input/output matching evaluation section. The second switching section is connected in parallel with the cross-coupled section, and the current mirror connection section is connected in a current-mirror configuration with a transistor in the second switching section. The third switching section is connected in series with the current mirror connection section, and the input/output matching evaluation section is used to control a transistor in the third switching section by receiving the input signal and an output node signal.

14 Claims, 10 Drawing Sheets

[OUTPUT WAVEFORMS]

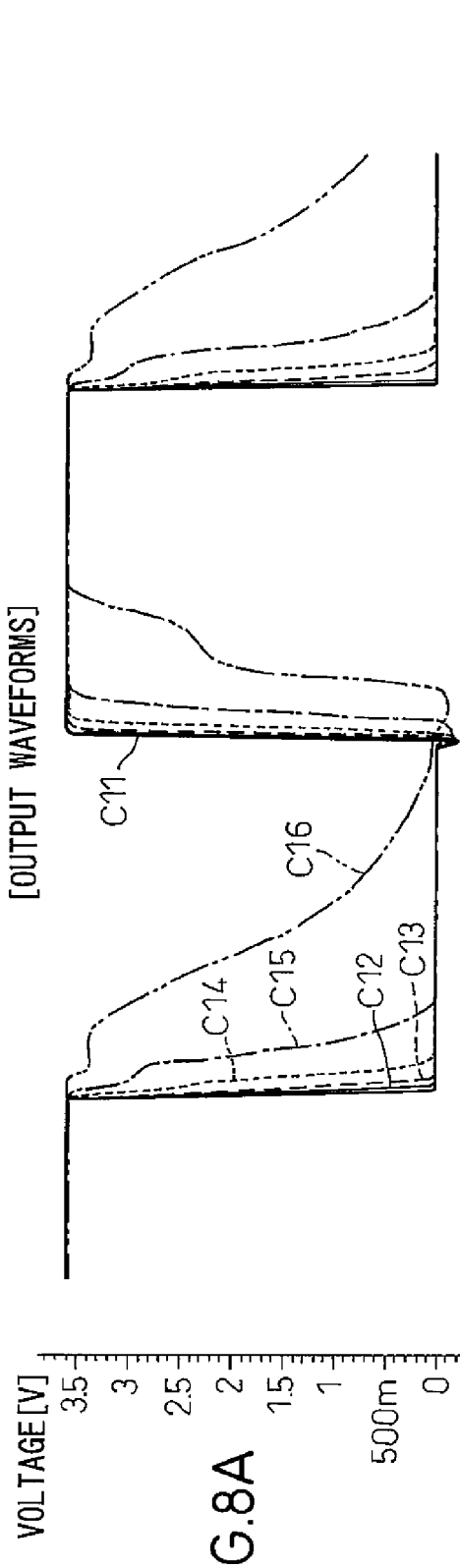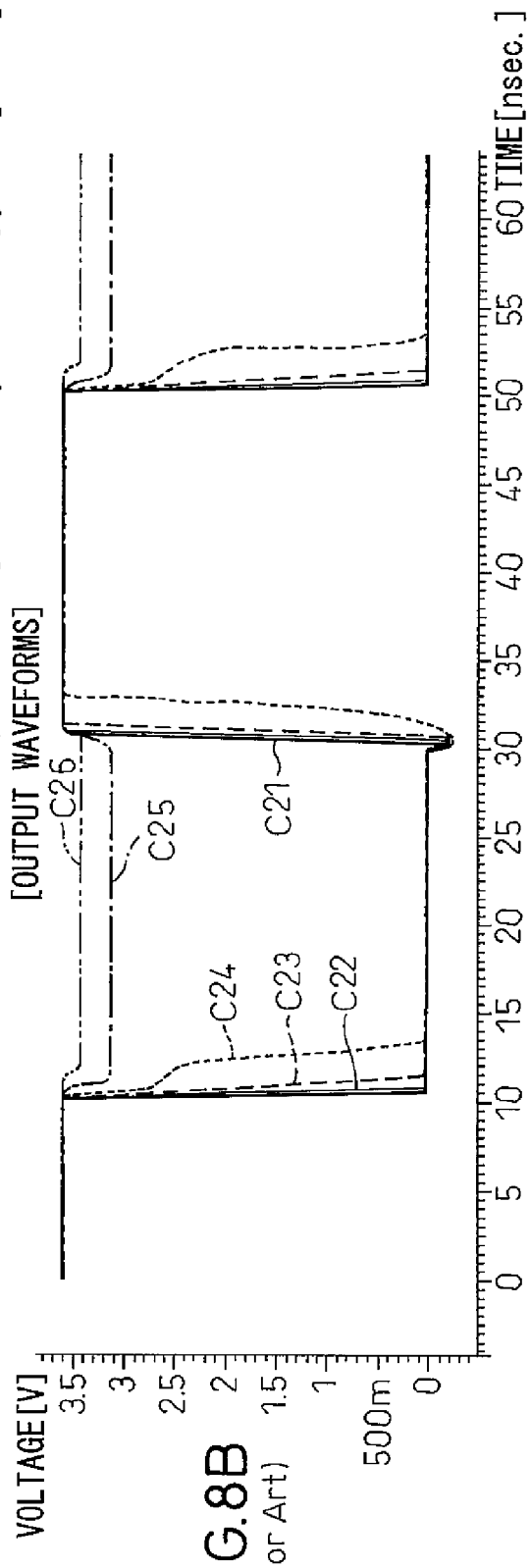
FIG.8A
FIG.8B (Prior Art)

LEVEL CONVERTER

CROSS REFERENCE TO RELATED APPLICATION

This application is based upon and claims the benefit of priority of the prior Japanese Patent Application No. 2008-093419, filed on Mar. 31, 2008, the entire contents of which are incorporated herein by reference.

FIELD

The embodiments discussed herein are related to a level converter.

BACKGROUND

In recent semiconductor devices, to reduce power consumption the internal circuitry is designed to handle signals whose voltage level is lower than the signal level used outside the semiconductor device. That is, the supply voltage on which the internal circuitry is designed to operate is set lower than the signal level used outside the semiconductor device.

To achieve this, the input and output circuits of the semiconductor device are provided with a level converter for converting the signal level of the internal circuitry to the external signal level.

FIG. 1 is a circuit diagram illustrating one example of a prior art level converter.

The prior art level converter illustrated in FIG. 1 comprises a pair of cross-coupled p-channel MOS transistors (pMOS transistors) Tp1 and Tp2 and a pair of n-channel MOS transistors (nMOS transistors) Tn1 and Tn2 whose gates are supplied with complementary input signals.

The sources of the pMOS transistors Tp1 and Tp2 are connected to a high power supply line (AVD), and the drains of the pMOS transistors Tp1 and Tp2 are connected to the drains of the nMOS transistors Tn1 and Tn2 via nodes N1 and N2, respectively, while the sources of the nMOS transistors Tn1 and Tn2 are connected to a low power supply line (DVS).

Then, when the input signal, in or /in, supplied to the gate of either one of the nMOS transistors Tn1 and Tn2 goes to a high level "H", for example, when the input signal, in, supplied to the gate of the nMOS transistor Tn1 goes to a high level "H", and the input signal, /in, supplied to the gate of the nMOS transistor Tn2 goes to a low level "L", the node N1 is held at the low level "L", while on the other hand, the node N2 is held at the high level "H".

The voltages at which the respective nodes are held are determined by the bias voltages AVD and DVS of the circuit, but need not be the same as the input gate voltages (in and /in) of the nMOS transistors Tn1 and Tn2, and these node voltages make signal level conversion possible. Here, the voltages held at the nodes N1 and N2 produce an output voltage which is usually higher than the input voltage.

While the pMOS transistors Tp1 and Tp2 and nMOS transistors Tn1 and Tn2 used in the level converter illustrated in FIG. 1 are all slow transistors having breakdown voltages matched to the output voltage side, the input voltages to the nMOS transistors Tn1 and Tn2 are held low.

Next, consider the case where the input signal, in, supplied to the gate of the nMOS transistor Tn1 makes a transition from the low level "L" to the high level "H" (the input signal, /in, supplied to the gate of the nMOS transistor Tn2 makes a transition from the high level "H" to the low level "L").

In the initial state, the node N1 is at the high level "H", and the node N2 is at the low level "L". Therefore, the pMOS transistor Tp1 is ON.

Subsequently, when the input signal, in, makes a transition from the low level "L" to the high level "H", the nMOS transistor Tn1 also turns ON, but since the nMOS transistor Tn2 and the pMOS transistor Tp2 are both OFF, the initial change of the circuit's internal state begins by gradually lowering the voltage at the node N1 as the nMOS transistor Tn1 overcomes the pMOS transistor Tp1.

When the voltage of the node N1 drops to a certain level (approximately equal to the threshold voltage of the pMOS transistors), the pMOS transistor Tp2 begins to turn ON, so that the potential at the node N2 gradually rises, causing the force of the pMOS transistor Tp1 to decrease, and thereafter, the state changes at an increasingly rapid pace.

Here, if the driving capabilities of the nMOS transistors are made smaller than those of the pMOS transistors, the initial change is slow, but the pace of changing state thereafter is rapid. Conversely, if the driving capabilities of the nMOS transistors are made larger than those of the pMOS transistors, the initial change is rapid, but the pace of changing state thereafter is slow. Therefore, the level converter of FIG. 1 cannot have a high speed operation characteristic. Furthermore, since the nMOS transistors are driven at a lower voltage, a further delay may be caused.

In view of the above, various improvements to the level converter illustrated in FIG. 1 have been proposed in the prior art.

Specifically, in one proposed level converter, to reduce the voltages applied to the drains of the nMOS differential transistor pair, nMOS transistors are connected in a cascode configuration between the cross-coupled pMOS transistor pair and the nMOS differential transistor pair so that the level converter can operate at a low supply voltage despite the presence of the high supply voltage (see, for example, Japanese Patent No. 2816124: FIG. 2).

There is also proposed in the prior art a level converter featuring a low current consumption and fast response; this level converter comprises a basic level shift circuit having the characteristic of being quick in falling but slow in rising, two additional transistors connected in parallel for accelerating the rising of the level shift circuit, and a signal change detection pulse generating circuit for generating a pulse by capturing the falling of a signal, wherein the acceleration transistors are operated by detecting the falling of one output signal and generating a pulse so as to accelerate the rising of the other output signal (see, for example, Japanese Laid-open Patent Publication No. 05-343980: FIG. 1).

The prior art further proposes a level converter that uses a current mirror circuit to achieve high speed operation while reducing the input signal voltages (see, for example, Japanese Laid-open Patent Publication No. 2005-033718: FIG. 3).

As earlier described, it has been difficult to achieve high speed operation with the prior art level converter described, for example, with reference to FIG. 1.

FIG. 2 is a circuit diagram illustrating another example of a prior art level converter, which is described in the above-cited patent document 1.

In the prior art level converter illustrated in FIG. 2, to reduce the voltages applied to the drains (nodes N1 and N2) of the nMOS transistors Tn1 and Tn2, nMOS cascode transistors Tn31 and Tn32 are connected between the nodes N1, N2 and the drains of the nMOS transistors Tn1 and Tn2, and core transistors capable of high speed operation with a low driving voltage are used as the nMOS transistors Tn1 and Tn2.

In FIG. 2, a resistor Rv and an nMOS transistor Tn33 are for generating a bias voltage Vb to be applied to the gates of the nMOS cascode transistors Tn31 and Tn32.

The prior art level converter illustrated in FIG. 2 is capable of high speed operation but has the problem that the power consumption increases because a steady-state current flows.

FIGS. 3A, 3B, and 3C are circuit diagrams illustrating a further example of a prior art level converter.

In the prior art level converter illustrated in FIG. 3A, the cross-coupled pMOS transistors Tp1 and Tp2 are formed from small (narrow gate width) transistors, and large (wide gate width) pMOS transistors Tp3 and Tp4 are provided in parallel with them.

Here, as illustrated in FIG. 3C, for example, the gate of the pMOS transistor Tp3 is supplied with a control signal CS1 having a prescribed delay and pulse width, created through inverters I21 to I24 and a NAND gate 2 by taking the signal of the node N2 as an input, and control is performed so that when the pMOS transistor Tp1 is turned ON, the pMOS transistor Tp3 is forcefully turned ON for the duration corresponding to the prescribed pulse width.

Similarly, as illustrated in FIG. 3B, for example, the gate of the pMOS transistor Tp4 is supplied with a control signal CS2 having a prescribed delay and pulse width, created through inverters I11 to I14 and a NAND gate 1 by taking the signal of the node N1 as an input, and control is performed so that when the pMOS transistor Tp2 is turned ON, the pMOS transistor Tp4 is forcefully turned ON for the duration corresponding to the prescribed pulse width.

That is, the pMOS transistors Tp3 and Tp4 provided in parallel with the cross-coupled pMOS transistors Tp1 and Tp2 are normally OFF, but are turned ON only when the respective input signals, in and /in, change state.

More specifically, when the input signal, in, changes from the low level "L" to the high level "H", the nMOS transistor Tn1 is turned ON, but since the pMOS transistor Tp1 is small (the driving capability is small), and the pMOS transistor Tp3 is OFF, the node N1 rapidly falls from the high level "H" to the low level "L".

Then, as the voltage at the node N1 changes, the control signal CS2 created through the inverters I11 to I14 and NAND gate 1 changes from H to L and then to H (held at the low level "L" for a prescribed length of time), and the large (large driving capability) pMOS transistor Tp4 is turned ON for the prescribed length of time, forcing the potential at the node N2 to change from the low level "L" to the high level "H".

In this way, the prior art level converter illustrated in FIG. 3A is capable of achieving high speed operation without causing an increase in power consumption. Here, the pulse width of each of the signals CS1 and CS2 for controlling the pMOS transistors Tp3 and Tp4 is determined, for example, by the delay introduced through the multi-stage inverter circuit. Accordingly, in actual use, the number of inverter stages for introducing the delay has to be increased, resulting in the problem that the amount of circuitry increases.

SUMMARY

According to an aspect of the embodiments, a level converter includes a cross-coupled section for holding data and a first switching section connected in series with the cross-coupled section and supplied with a differential input signal. The level converter has a second switching section, a current mirror connection section, a third switching section, and an input/output matching evaluation section.

The second switching section is connected in parallel with the cross-coupled section, and the current mirror connection section is connected in a current-mirror configuration with a transistor in the second switching section. The third switching section is connected in series with the current mirror connection section, and the input/output matching evaluation section is used to control a transistor in the third switching section by receiving the input signal and an output node signal.

Further, according to another aspect of the embodiments, a level converter includes first and second transistors of a first conductivity type, third and fourth transistors of a second conductivity type opposite to the first conductivity type, fifth and sixth transistors of the first conductivity type, seventh and eighth transistors of the first conductivity type, ninth and tenth transistors of the second conductivity type.

First electrodes of the first and second transistors are connected to a first power supply line, and control electrodes and second electrodes thereof are cross-coupled to each other.

First electrodes of the third and fourth transistors are connected to a second power supply line, second electrodes thereof are connected to the second electrodes of the first and second transistors, and control electrodes thereof are supplied with a differential input signal.

The fifth and sixth transistors are connected in parallel with the first and second transistors, and the seventh and eighth transistors are connected in a current-mirror configuration with the fifth and sixth transistors.

The ninth and tenth transistors are connected in series with the seventh and eighth transistors, and control electrodes thereof are supplied with a signal output from a logic circuit.

A potential change at one of connection nodes connecting between the first and second transistors and the third and fourth transistors is accelerated by the signal output from the logic circuit.

Additional objects and advantages of the embodiments will be set forth in part in the description which follows, and in part will be obvious from the description, or may be learned by practice of the embodiment. The object and advantages of the embodiments will be realized and attained by means of the elements and combinations particularly pointed out in the appended claims.

It is to be understood that both the foregoing general description and the following detailed description are exemplary and explanatory only and are not restrictive of the embodiments, as claimed.

BRIEF DESCRIPTION OF DRAWINGS

FIGS. 8A and 8B are diagrams (part 2) illustrating the operation of the level converter of FIG. 6 for comparison with the prior art example;

DESCRIPTION OF EMBODIMENTS

Before proceeding to the detailed description of the preferred embodiments of the level converter, the general configuration of the level converter for carrying out the present embodiments will be described with reference to FIG. 4.

Figure 4:
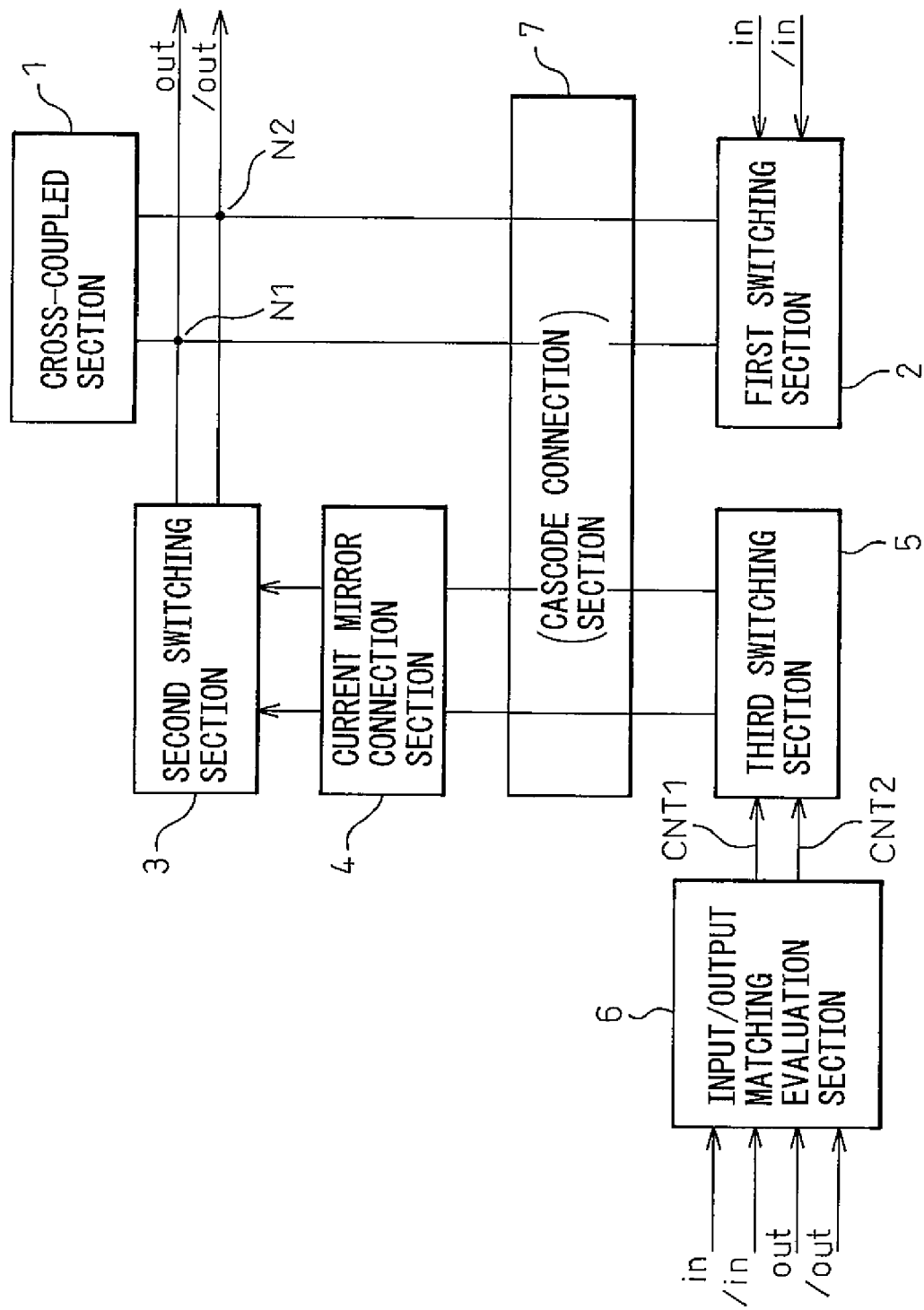
FIG. 4 is a block diagram illustrating the general configuration of a level converter for carrying out the present embodiments.

As illustrated in FIG. 4, the level converter for carrying out the present embodiments comprises a cross-coupled section 1, a first switching section 2, a second switching section 3, a current mirror connection section 4, a third switching section 5, and an input/output matching evaluation section 6.

The cross-coupled section 1, and the first switching section 2, which is connected in series with the cross-coupled section 1 and is supplied with differential input signals, in and /in, hold data and convert the voltage level of the input signals, in and /in, to the voltages of the outputs, out and /out (nodes N1 and N2). The second switching section 3 is connected in parallel with the cross-coupled section 1, while the current mirror connection section 4 is connected in a current-mirror configuration with the transistors in the second switching section 3.

The third switching section 5 is connected in series with the current mirror connection section 4, and the input/output matching evaluation section 6 controls the transistors in the third switching section 5 by receiving the input signals, in and /in, and the signals, out and /out, of the output nodes N1 and N2.

In this way, the level converter of the present embodiments differs from the prior art level converter (see FIG. 1), which comprises the cross-coupled section 1 and the first switching section 2, by the inclusion of the input/output matching evaluation section 6 which evaluates the difference between the input (in, /in) and the output (out, /out), the third switching section 5 which is controlled by the control signal (CNT1, CNT2) from the input/output matching evaluation section 6, the current mirror connection section 4 which mirrors the current flowing in the third switching section 5, and the second switching section 3 which is connected in parallel with the cross-coupled section 1 and performs switching by the mirrored current. Then, high speed operation is achieved by accelerating the change of the output through the use of the second switching section 3.

The level converter of FIG. 4 may further include between the current mirror connection section 4 and the third switching section 5 a cascode connection section 7 having transistors cascoded to the transistors in the third switching section 5.

Preferred embodiments of the level converter will be described in detail below with reference to the accompanying drawings.

Figure 5:
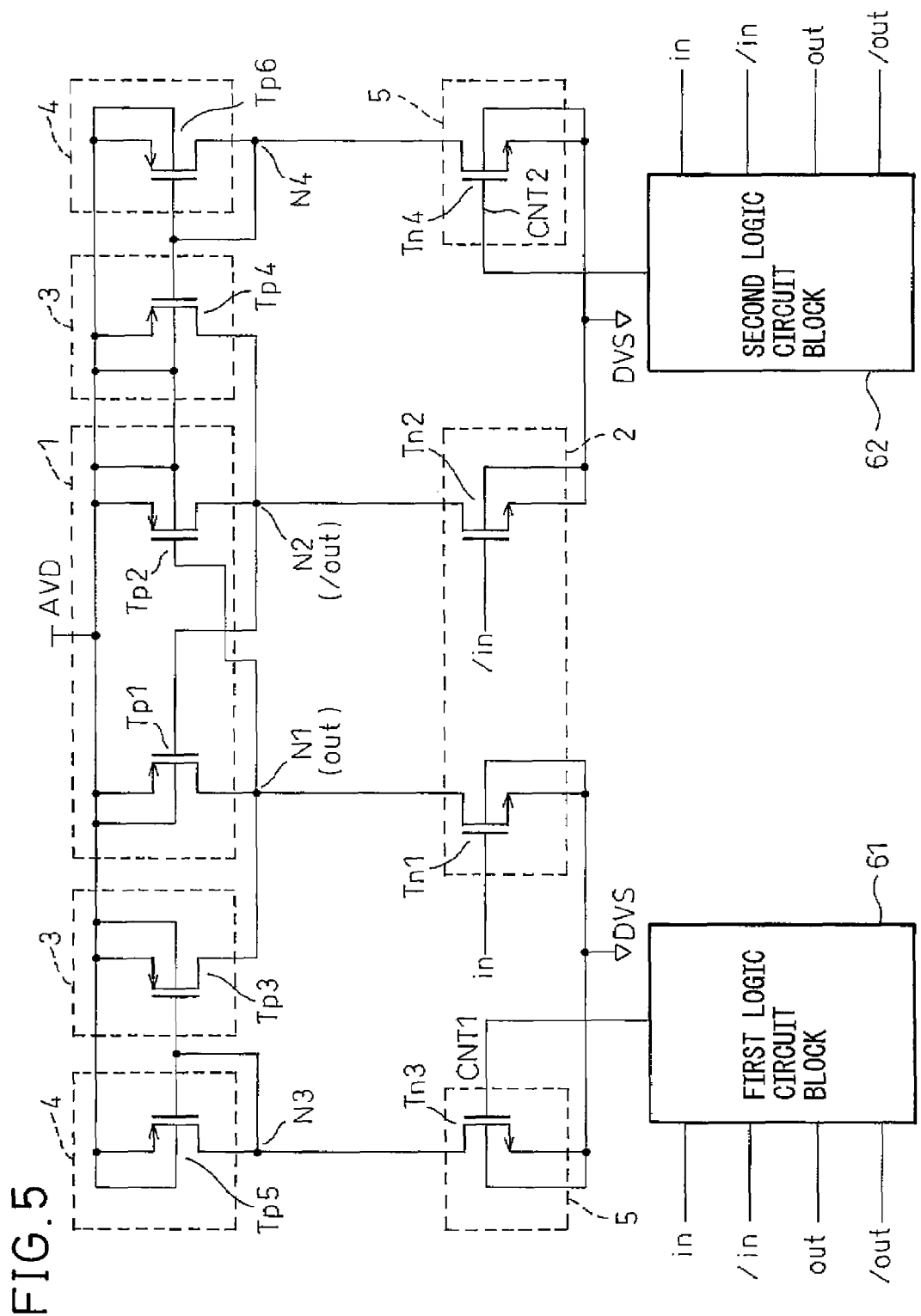
FIG. 5 is a circuit diagram illustrating a first embodiment of the level converter.

FIG. 5 is a circuit diagram illustrating a first embodiment of the level converter.

The level converter of the first embodiment comprises a pair of cross-coupled pMOS transistors Tp1 and Tp2 (the cross-coupled section 1) and a pair of nMOS transistors Tn1 and Tn2 (the first switching section 2) whose gates are supplied with complementary input signals.

The sources of the pMOS transistors Tp1 and Tp2 are connected to a high power supply line (AVD), and the drains of the pMOS transistors Tp1 and Tp2 are connected to the drains of the nMOS transistors Tn1 and Tn2 via nodes N1 and N2, respectively, while the sources of the nMOS transistors Tn1 and Tn2 are connected to a low power supply line (DVS).

Further, pMOS transistors Tp3 and Tp4 are connected in parallel with the pMOS transistors Tp1 and Tp2. The pMOS transistors Tp3 and Tp4 are connected in a current-mirror configuration with pMOS transistors Tp5 and Tp6, respectively, and the drains of the pMOS transistors Tp5 and Tp6 are connected to the drains of nMOS transistors Tn3 and Tn4 via nodes N3 and N4, respectively.

The gate of the nMOS transistor Tn3 is supplied with the control signal CNT1 from a first logic circuit block 61, while the gate of the nMOS transistor Tn4 is supplied with the control signal CNT2 from a second logic circuit block 62.

Here, the pMOS transistors Tp1 and Tp2 correspond to the cross-coupled section 1, the nMOS transistors Tn1 and Tn2 correspond to the first switching section 2, and the pMOS transistors Tp3 and Tp4 correspond to the second switching section 3.

Further, the pMOS transistors Tp5 and Tp6 correspond to the current mirror connection section 4, the nMOS transistors Tn3 and Tn4 correspond to the third switching section 5, and the first logic circuit block 61 and the second logic circuit block 62 correspond to the input/output matching evaluation section 6.

That is, in the level converter of the first embodiment illustrated in FIG. 5, the pMOS transistors Tp3 and Tp4 are connected in parallel with the cross-coupled pMOS transistors Tp1 and Tp2, and the currents flowing in the nMOS transistors Tn3 and Tn4 which respectively turn ON under prescribed conditions are mirrored via the intervening pMOS transistors Tp5 and Tp6 to the pMOS transistors Tp3 and Tp4.

Here, the pMOS transistors Tp3 and Tp4 are chosen, for example, to have a larger size, i.e., a wider gate width, than the other pMOS transistors Tp1, Tp2, Tp5, and Tp6; this serves to accelerate the potential rise at the node N1 or N2, achieving high speed operation of the level converter.

Figure 6:
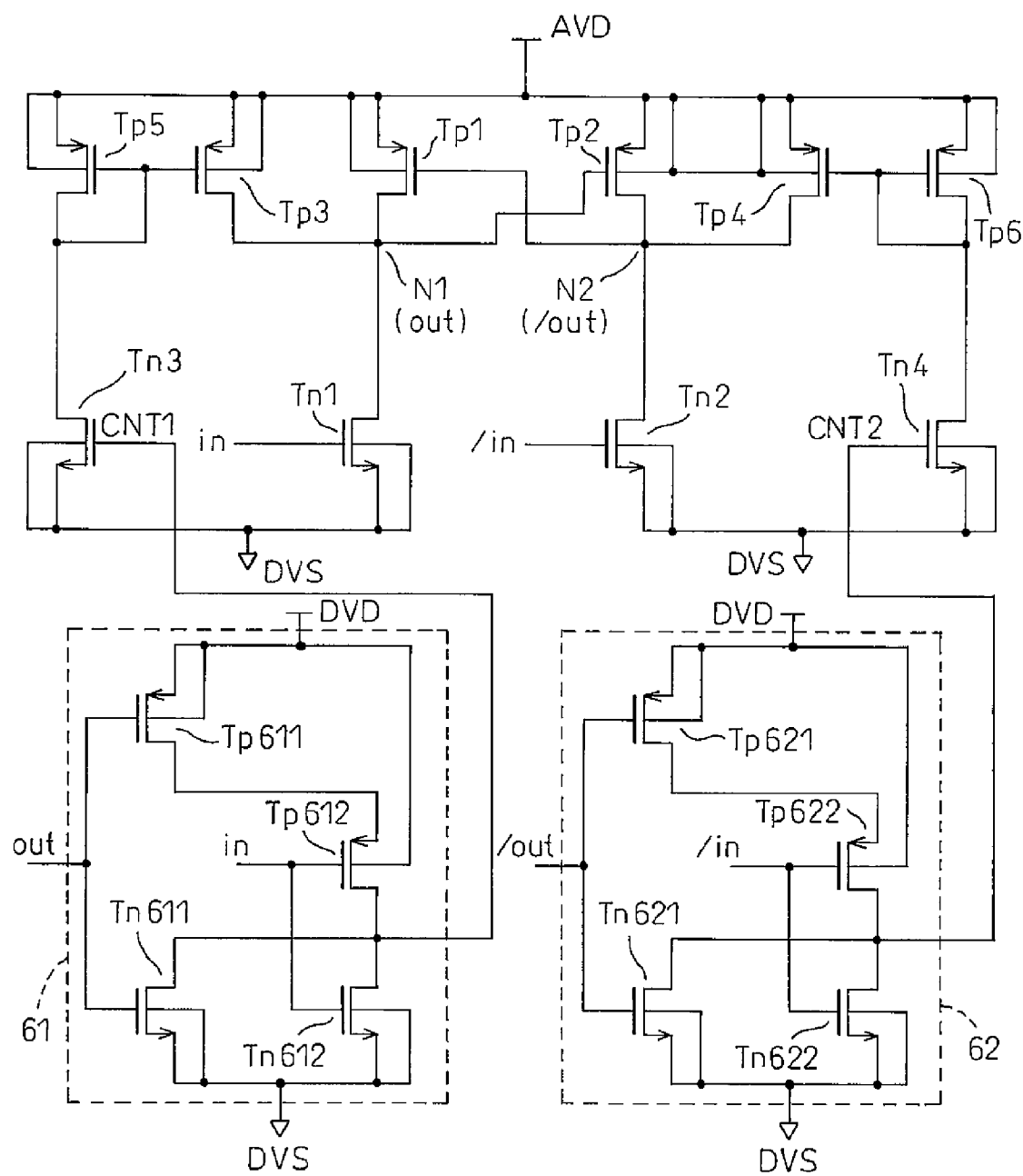
FIG. 6 is a circuit diagram illustrating one example of logic circuit blocks included in the level converter illustrated in FIG. 5.

FIG. 6 is a circuit diagram illustrating one example of the logic circuit blocks included in the level converter illustrated in FIG. 5.

As illustrated in FIG. 6, the first logic circuit block 61 is constructed as a NOR gate comprising pMOS transistors Tp611, Tp612 and nMOS transistors Tn611, Tn612, and is designed so that the control signal CNT1 supplied to the gate of the nMOS transistor Tn3, for example, is caused to change to the high level "H" only when the input signal, in, and the output signal, out (the potential at the node N1), are both at the low level "L".

Similarly, the second logic circuit block 62 is constructed as a NOR gate comprising pMOS transistors Tp621, Tp622 and nMOS transistors Tn621, Tn622, and is designed so that the control signal CNT2 supplied to the gate of the nMOS transistor Tn4, for example, is caused to change to the high level "H" only when the input signal, /in, and the output signal, /out (the potential at the node N2), are both at the low level "L".

Here, the first circuit block 61 and the second logic circuit block 62 are both driven by a low supply voltage DVD (for example, 1.2 V), not by a high supply voltage AVD (for example, 3.3 V) used for voltage level conversion, and a steady-state current does not flow.

That is, the control signals CNT1 and CNT2 output from the first and second circuit blocks 61 and 62 (the input/output matching evaluation section 6) change to the high level "H" only at the time of state transition, the current flows through the path leading from the nMOS transistor Tn3 (Tn4) to the pMOS transistor Tp3 (Tp4) via the pMOS transistor Tp5 (Tp6) only at the time of state transition.

Further, the first and second circuit blocks 61 and 62 each perform circuit operation such that when the input signal, in or /in, changes from H to L, the output signal, out or /out, changes from L to H. Here, the transistors Tp612 and Tp622 responsible for causing the output to change from L to H when the input signal changes from H to L are driven by the low supply voltage DVD, but are constructed from high-speed transistors, whereas the transistors Tp611 and Tp621 responsible for causing the control signals CNT1 and CNT2 output from the first and second circuit blocks 61 and 62, respectively, to change from L to H and then to L when the corresponding output signal, out or /out, changes from L to H are constructed from low-speed transistors, but are driven by the higher supply voltage AVD, and high speed operation can thus be achieved.

Since the pMOS transistors Tp3 and Tp4 are driven via the pMOS transistors Tp5 and Tp6 and the nMOS transistors Tn3 and Tn4 by the control signals CNT1 and CNT2 output from the first and second circuit blocks 61 and 62 capable of high speed operation, the levels at the nodes N1 and N2 can be caused to change at high speed.

Figure 7:
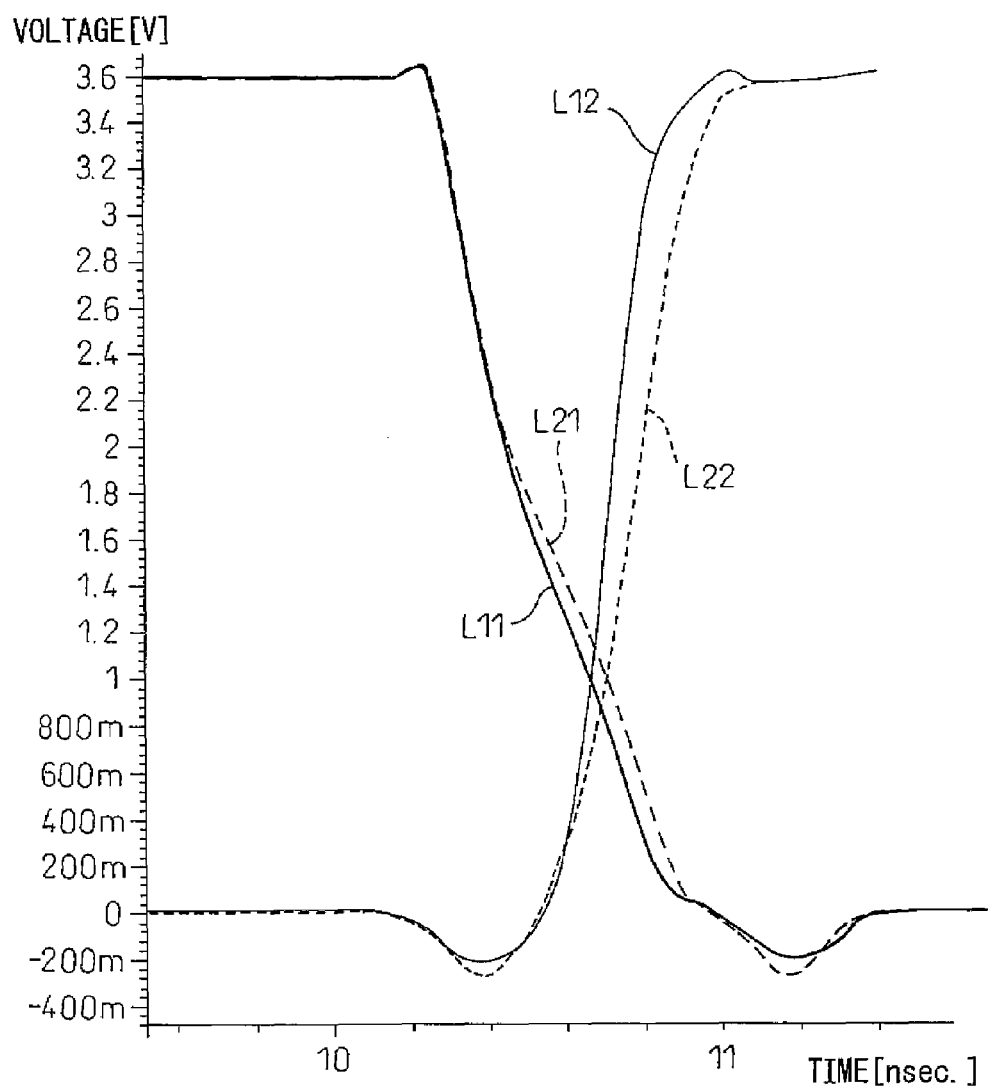
FIG. 7 is a diagram (part 1) illustrating the operation of the level converter of FIG. 6 for comparison with the prior art example.

FIG. 7 is a diagram (part 1) illustrating the operation of the level converter of FIG. 6 for comparison with the prior art example; here, the waveforms of the outputs, out and /out, are illustrated. In FIG. 7, curves L11 and L12 represent the voltages at the nodes N1 and N2 in the first embodiment illustrated in FIG. 6, while L21 and L22 represent the voltages at the nodes N1 and N2 in the prior art example illustrated in FIG. 1.

As is apparent from a comparison between the curves L11 and L21 and a comparison between the curves L12 and L22, it can be seen that, for the voltages of the outputs, out and /out (nodes N1 and N2), the level transition is accomplished in an appreciably shorter time in the level converter of the first embodiment.

That is, when the voltage at the node N1 (out) changes from the high level "H" (3.6 V) from the low level "L" (0 V), for example, the positive logic output, out (curve L11), in the first embodiment falls quicker than the positive logic output, out (curve L21), in the prior art example, and the negative logic output, /out (curve L12), in the first embodiment rises quicker than the negative logic output, /out (curve L22), in the prior art example.

FIGS. 8A and 8B are diagrams (part 2) illustrating the operation of the level converter of FIG. 6 for comparison with the prior art example: FIG. 8A illustrates the results of the simulation of the level conversion (worst case) in the first embodiment, and FIG. 8B illustrates the results of the simulation of the level conversion (worst case) in the prior art example illustrated in FIG. 1.

In FIGS. 8A and 8B, curves C11 and C21 illustrate the case where a 1.2-V input signal (an input signal having an amplitude of 1.2 V), in and /in, is converted to an output signal, out and /out, having an amplitude of 3.6 V (the case of 1.2 V to 3.6 V conversion); similarly, curves C12 and C22 illustrate the case of 1.1 V to 3.6 V conversion, curves C13 and C23 illustrate the case of 1.0 V to 3.6 V conversion, curves C14 and C24 illustrate the case of 0.9 V to 3.6 V conversion, curves C15 and C25 illustrate the case of 0.8 V to 3.6 V conversion, and curves C16 and C26 illustrate the case of 0.8 V to 3.6 V conversion.

Figure 1:
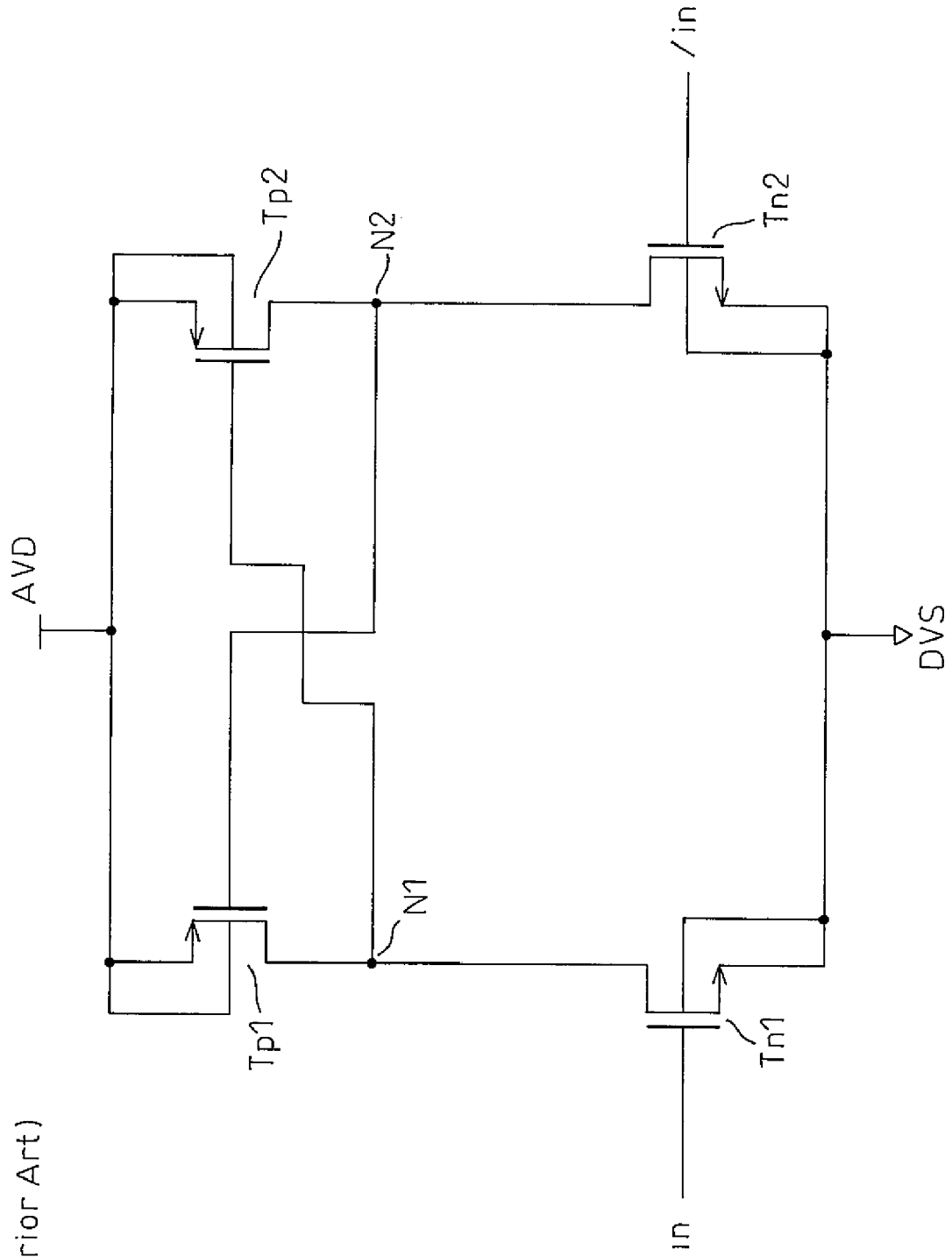
FIG. 1 is a circuit diagram illustrating one example of a prior art level converter.
Figure 2:
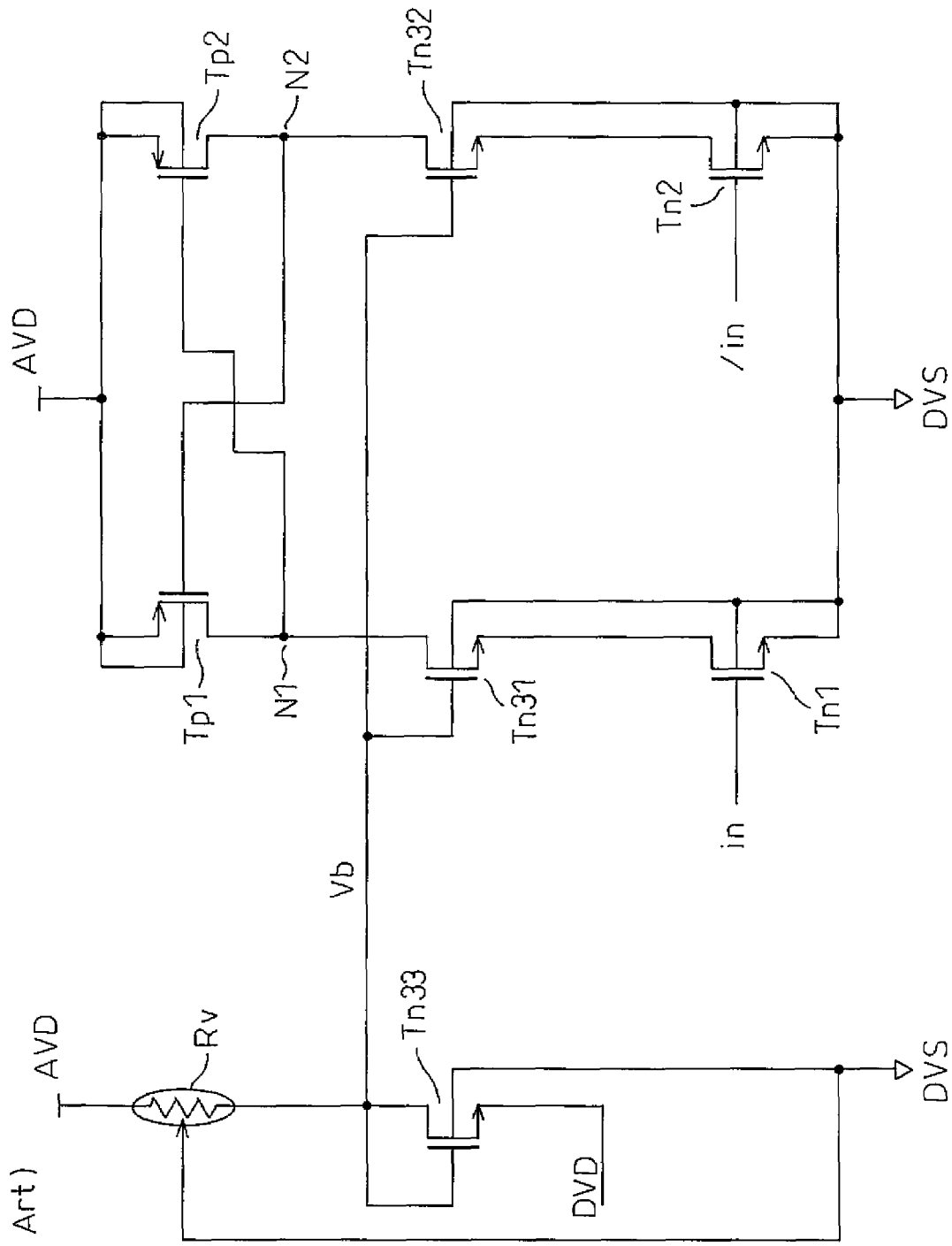
FIG. 2 is a circuit diagram illustrating another example of a prior art level converter.
Figure 3:
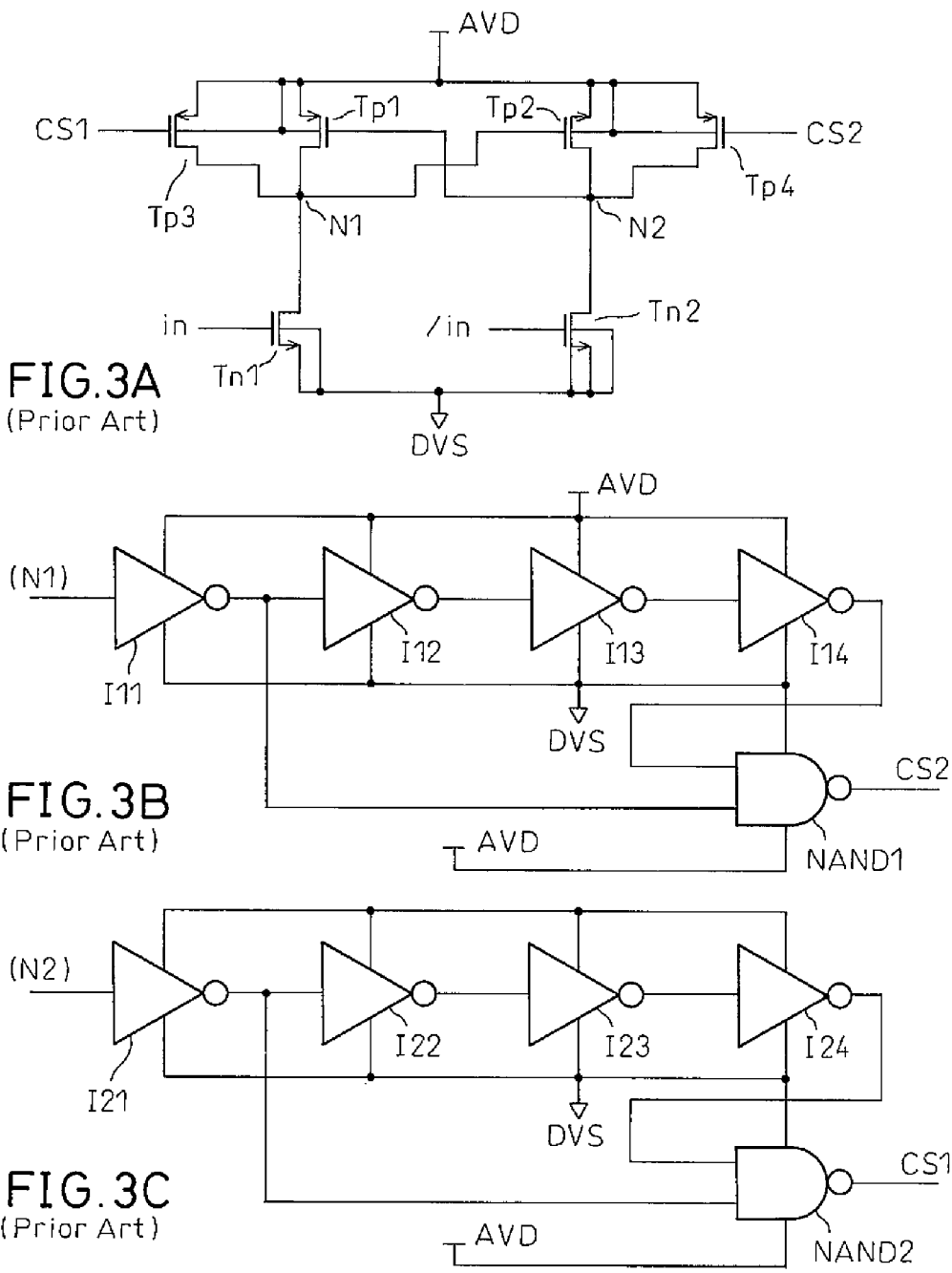
FIGS. 3A, 3B, and 3C are circuit diagrams illustrating a further example of a prior art level converter.

As is apparent from a comparison of FIGS. 8A and 8B, the level converter of the first embodiment can convert the 0.7-V input signal, in and /in, to the 3.6-V output signal, out and /out (see curves C11 to C16), whereas with the prior art level converter illustrated in FIG. 1, the lowest input signal that can be converted to the 3.6-V output signal is 0.9 V (see curves C21 and C24), and it is difficult to convert the 0.7-V to 0.8-V input signal, in and /in, to the 3.6-V output signal, out and /out (see curves C25 and C26).

As can be seen, the level converter of the first embodiment can convert a lower input signal voltage up to the designated voltage than the prior art can, and thus a wider application range can be achieved.

Figure 9:
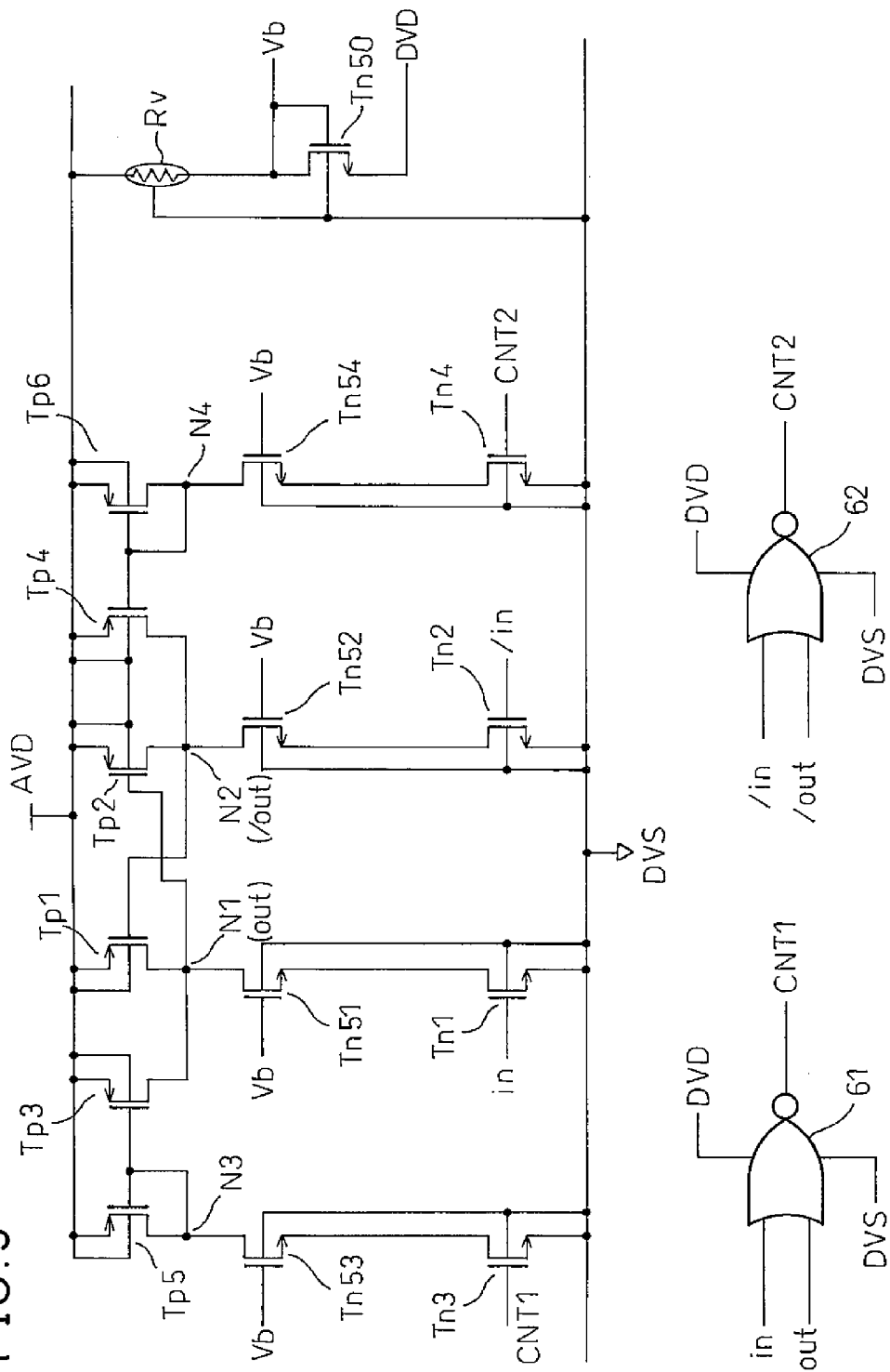
FIG. 9 is a circuit diagram illustrating a second embodiment of the level converter.

FIG. 9 is a circuit diagram illustrating a second embodiment of the level converter.

As is apparent from a comparison of FIG. 9 and FIG. 6 (FIG. 5), the level converter of the second embodiment differs from the level converter of the first embodiment in that nMOS transistors Tn51, Tn52, Tn53, and Tn54 are inserted between the pMOS transistors Tp1 (Tp3), Tp2 (Tp4), Tp5, Tp6 and the nMOS transistors Tn1, Tn2, Tn3, Tn4, respectively.

That is, the transistors Tn51 to Tn54 are cascoded to the transistors Tn1 to Tn4, and transistors capable of operating with a low supply voltage are used as the transistors Tn1 to Tn4 to achieve high speed operation.

Here, a resistor Rv and an nMOS transistor Tn50 are provided for generating a bias voltage Vb to be applied to the gates of the nMOS cascode transistors Tn51 to Tn54.

Figure 10:
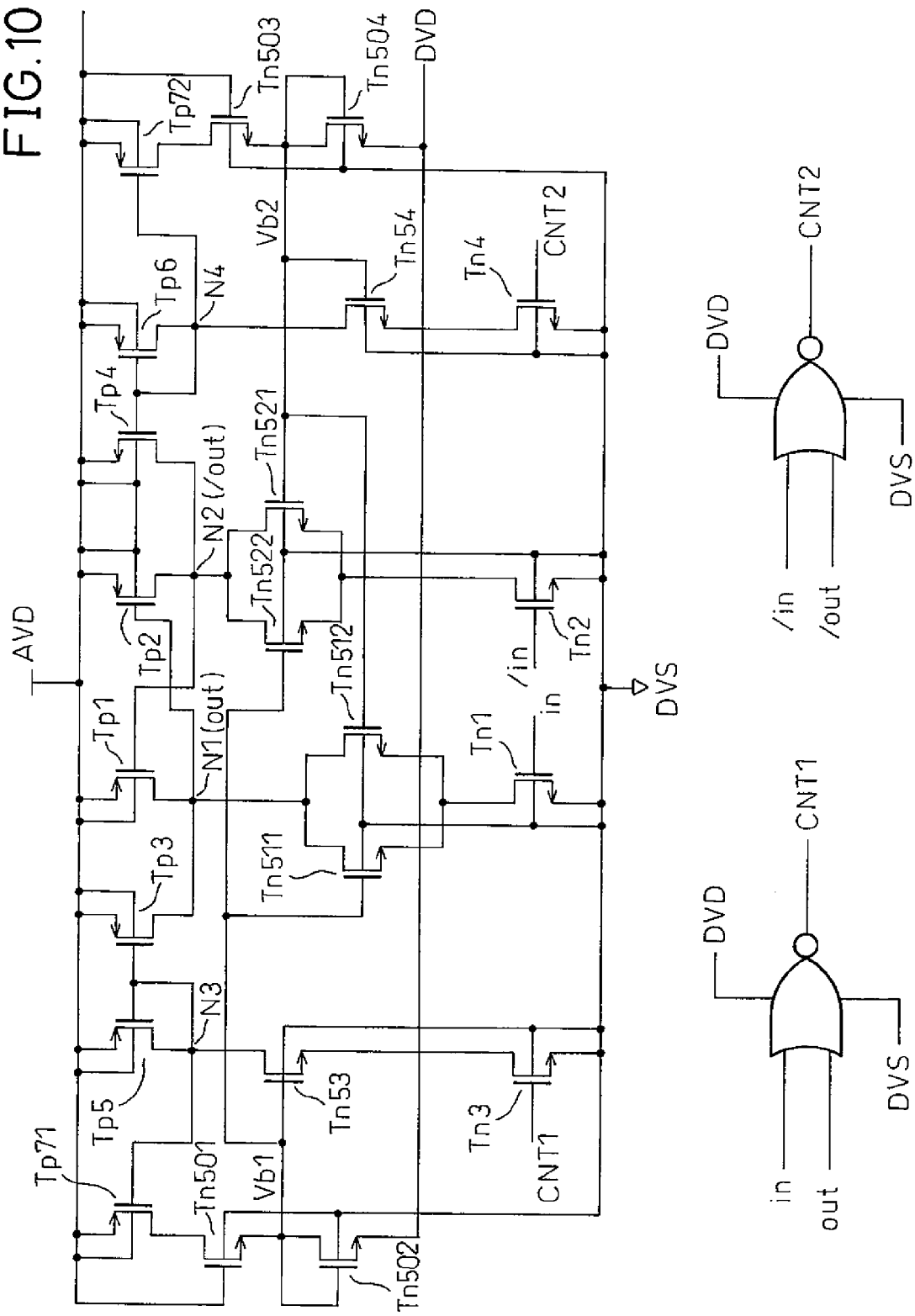
FIG. 10 is a circuit diagram illustrating a third embodiment of the level converter.

FIG. 10 is a circuit diagram illustrating a third embodiment of the level converter, in which to reduce power consumption, the bias voltage Vb is applied to the nMOS cascode transistors Tn51 to Tn54 only when the input signal, in or /in, makes a transition from one level to the other.

As is apparent from a comparison of FIG. 10 and FIG. 9, the level converter of the third embodiment differs from the level converter of the second embodiment in that the nMOS transistor Tn51 is constructed as two paralleled nMOS transistor Tn511 and Tn512 and in that the nMOS transistor Tn52 is constructed as two paralleled nMOS transistor Tn521 and Tn522.

Further, the bias voltage generating circuit is constructed from a pair of circuits, one comprising a pMOS transistor Tp71 and nMOS transistors Tn501 and Tn502 connected in series to generate a first bias voltage Vb1, and the other comprising a pMOS transistor Tp72 and nMOS transistors Tn503 and Tn504 connected in series to generate a second bias voltage Vb2.

The first bias voltage Vb1 is applied to the gates of the nMOS transistors Tn511, Tn522, and Tn53, and the second bias voltage Vb2 is applied to the gates of the nMOS transistors Tn512, Tn521, and Tn54. In the pair of bias voltage generating circuits, the nMOS transistors Tn501 and Tn502 also function as ESD (electrostatic discharge) protection devices.

Further, in the pair of bias voltage generating circuits (Tp71, Tn501, Tn502 and Tp72, Tn503, Tn504), the pMOS transistors Tp71 and Tp72 are connected in a current-mirror configuration with the pMOS transistors Tp5 and Tp6, respectively.

Then, when input signal, in, changed from the high level "H" to the low level "L", and the node N1 is still kept at the low level "L", for example, the nMOS transistor Tn3 is turned ON by the control signal CNT1, and current flows to the pMOS transistor Tp5, whereupon current also flows to the pMOS transistor Tp71, and the first bias voltage Vb1 goes high and is applied to the gates of the nMOS cascode transistors Tn53, Tn511 and Tn522 for operation, and thereby operation is accelerated.

In this case, since the control signal CNT2 is held at the low level "L", the nMOS transistor Tn4 is OFF, and current does not flow to the pMOS transistor Tp6; as a result, the pMOS transistor Tp72 is also OFF. Since Tp72 is OFF, no current flow in the voltage generator circuits for gate biasing to the gates of the cascode transistors, which can reduce the power consumption of the circuitry.

In this way, according to the level converter of the third embodiment, high speed operation can be achieved while suppressing an increase in power consumption.

It will be recognized that the circuit configurations of the above embodiments are only examples and can be modified in various ways. Specifically, it will be appreciated that in the circuit of each embodiment, the polarity of the power supply and the conductivity type of each transistor, for example, may be inverted, or the first and second circuit blocks 61 and 62 may each be constructed as a logic circuit other than a NOR gate.

In the above description, the low power supply lines for the high and low supply voltages AVD and DVD are described by the same low power supply lines in an IC chip (semiconductor device). However, the low power supply lines for AVD and DVD may be divided in the IC chip, so as to avoid influences of respective voltage fluctuations based on AVD and DVD.

As described in detail above, according to each of the above embodiments, a level converter capable of high speed operation can be achieved without causing an appreciable increase in power consumption and without substantially increasing the amount of circuitry.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A level converter comprising a cross-coupled section for holding data and a first switching section connected in series with the cross-coupled section and supplied with a differential input signal, the level converter comprising:
   a second switching section connected in parallel with the cross-coupled section;
   a current mirror connection section connected in a current-mirror configuration with a transistor in the second switching section;
   a third switching section connected in series with the current mirror connection section; and
   an input/output matching evaluation section for controlling a transistor in the third switching section by receiving the differential input signal and an output node signal.

2. The level converter as claimed in claim 1, further comprising a cascode connection section provided between the current mirror connection section and the third switching section and having a transistor cascoded to the transistor in the third switching section.

3. A level converter comprising:
   first and second transistors of a first conductivity type, whose first electrodes are connected to a first power supply line, and whose control electrodes and second electrodes are cross-coupled to each other;
   third and fourth transistors of a second conductivity type opposite to the first conductivity type, whose first electrodes are connected to a second power supply line, whose second electrodes are connected to the second electrodes of the first and second transistors, and whose control electrodes are supplied with a differential input signal;
   fifth and sixth transistors of the first conductivity type, which are connected in parallel with the first and second transistors;
   seventh and eighth transistors of the first conductivity type, which are connected in a current-mirror configuration with the fifth and sixth transistors; and
   ninth and tenth transistors of the second conductivity type, which are connected in series with the seventh and eighth transistors, and whose control electrodes are supplied with a signal output from a logic circuit, wherein a potential change at one of connection nodes connecting between the first and second transistors and the third and fourth transistors is accelerated by the signal output from the logic circuit.

4. The level converter as claimed in claim 3, wherein the logic circuit receives the differential input signal and the potential of the connection node, and when there is a need to change the potential of the connection node connecting between the first transistor and the third transistor, the ninth transistor is turned ON, causing a current to flow via the seventh transistor into the fifth transistor connected in a current-mirror configuration with the seventh transistor.

5. The level converter as claimed in claim 4, wherein the logic circuit receives the signal applied to the control electrode of the fourth transistor and the potential of the connection node connecting between the first transistor and the third transistor, and controls the signal to be supplied to the control electrode of the ninth transistor.

6. The level converter as claimed in claim 3, wherein the logic circuit receives the differential input signal and the potential of the connection node, and when there is a need to change the potential of the connection node connecting between the second transistor and the fourth transistor, the tenth transistor is turned ON, causing a current to flow via the eighth transistor into the sixth transistor connected in a current-mirror configuration with the eighth transistor.

7. The level converter as claimed in claim 6, wherein the logic circuit receives the signal applied to the control electrode of the third transistor and the potential of the connection node connecting between the second transistor and the fourth transistor, and controls the signal to be supplied to the control electrode of the tenth transistor.

8. The level converter as claimed in claim 3, wherein the fifth and sixth transistors are larger in driving capability than the first and second transistors and the seventh and eighth transistors.

9. The level converter as claimed in claim 3, wherein
   said level converter converts a signal of a first power supply level to a signal of a second power supply level lower than the first power supply level; and
   said logic circuit contains a transistor driven at the second power supply level.

10. The level converter as claimed in claim 3, further comprising 11th and 12th transistors and 13th and 14th transistors of the second conductivity type, which are cascoded to the third and fourth transistors and the ninth and tenth transistors, respectively.

11. The level converter as claimed in claim 10, wherein
   said level converter converts a signal of a first power supply level to a signal of a second power supply level lower than the first power supply level; and said third and fourth transistors and the ninth and tenth transistors are transistors driven at the second power supply level.

12. The level converter as claimed in claim 10, further comprising a bias current generating circuit for flowing a bias current to the 11th and 12th transistors and the 13th and 14th transistors.

13. The level converter as claimed in claim 12, wherein the bias current generating circuit flows the bias current to the 11th and 12th transistors and the 13th and 14th transistors only when a potential change occurs at either one of the connection nodes connecting between the first and second transistors and the third and fourth transistors.

14. The level converter as claimed in claim 3, wherein each of the transistors is a MOS transistor, the first power supply line is a high power supply line, the second power supply line is a low power supply line, the first conductivity type is a p-channel type, and the second conductivity type is an n-channel type.

* * * * *